(12) United States Patent
Chen

(10) Patent No.: US 8,993,979 B2
(45) Date of Patent: Mar. 31, 2015

(54) BEAM CONTROL ASSEMBLY FOR RIBBON BEAM OF IONS FOR ION IMPLANTATION

(71) Applicant: Advanced Ion Beam Technology, Inc., Hsin-Chu (TW)

(72) Inventor: Jiong Chen, San Jose, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 14/191,364

(22) Filed: Feb. 26, 2014

(65) Prior Publication Data

US 2014/0261181 A1 Sep. 18, 2014

Related U.S. Application Data

(63) Continuation of application No. 13/889,278, filed on May 7, 2013, now Pat. No. 8,680,480, which is a continuation of application No. 12/957,294, filed on Nov. 30, 2010, now Pat. No. 8,502,160, which is a continuation of application No. 12/053,076, filed on Mar. 21, 2008, now Pat. No. 7,851,767.

(60) Provisional application No. 60/919,365, filed on Mar. 21, 2007.

(51) Int. Cl.
*G21K 1/08* (2006.01)
*H01J 37/32* (2006.01)
*G21K 1/093* (2006.01)
*G21K 5/04* (2006.01)
*H01J 37/147* (2006.01)
*H01J 37/317* (2006.01)
*H01J 37/30* (2006.01)

(52) U.S. Cl.
CPC .......... *H01J 37/32669* (2013.01); *G21K 1/093* (2013.01); *G21K 5/04* (2013.01); *H01J 37/1471* (2013.01); *H01J 37/3171* (2013.01); *H01J 37/3172* (2013.01); *H01J 37/3007* (2013.01); *H01J 2237/24542* (2013.01)
USPC ........................................ 250/396 R; 250/398

(58) Field of Classification Search
None
See application file for complete search history.

(56) References Cited

U.S. PATENT DOCUMENTS 1,201,220 A * 10/1916 Coulombe ....................... 261/48
1,331,018 A * 2/1920 Luthy ............................ 429/143
(Continued)

OTHER PUBLICATIONS

Non Final Office Action received for U.S. Appl. No. 12/053,076, mailed on Jan. 29, 2010, 11 pages.
(Continued)

*Primary Examiner* — Andrew Smyth
(74) *Attorney, Agent, or Firm* — Morrison & Foerster LLP

(57) ABSTRACT

A beam control assembly to shape a ribbon beam of ions for ion implantation includes a first bar, second bar, first coil of windings of electrical wire, second coil of windings of electrical wire, first electrical power supply, and second electrical power supply. The first coil is disposed on the first bar. The first coil is the only coil disposed on the first bar. The second bar is disposed opposite the first bar with a gap defined between the first and second bars. The ribbon beam travels between the gap. The second coil is disposed on the second bar. The second coil is the only coil disposed on the second bar. The first electrical power supply is connected to the first coil without being electrically connected to any other coil. The second electrical power supply is connected to the second coil without being electrically connected to any other coil.

19 Claims, 6 Drawing Sheets

(56) References Cited

U.S. PATENT DOCUMENTS

| | | | | |
|---|---|---|---|---|
| 2,220,097 | A * | 11/1940 | Greer | 198/468.6 |
| 2,720,087 | A * | 10/1955 | Groene | 62/230 |
| 4,712,042 | A * | 12/1987 | Hamm | 315/5.41 |
| 5,523,658 | A * | 6/1996 | Fukuma et al. | 315/368.19 |
| 5,717,371 | A * | 2/1998 | Crow | 335/216 |
| 5,834,786 | A * | 11/1998 | White et al. | 250/492.21 |
| 6,423,976 | B1 * | 7/2002 | Glavish et al. | 250/492.21 |
| 6,423,978 | B1 * | 7/2002 | Furuta et al. | 250/559.36 |
| 6,933,507 | B2 * | 8/2005 | Purser et al. | 250/396 ML |
| 6,933,607 | B2 * | 8/2005 | Ono et al. | 257/737 |
| 7,078,713 | B2 * | 7/2006 | White | 250/492.21 |
| 7,105,839 | B2 * | 9/2006 | White | 250/492.21 |
| 7,301,156 | B2 * | 11/2007 | Purser et al. | 250/396 ML |
| 7,326,941 | B2 * | 2/2008 | Chen et al. | 250/492.21 |
| 7,328,941 | B2 * | 2/2008 | Asbach et al. | 297/153 |
| 7,462,843 | B2 * | 12/2008 | Chen et al. | 250/492.21 |
| 7,525,103 | B2 * | 4/2009 | Purser et al. | 250/396 ML |
| 7,807,983 | B2 * | 10/2010 | Purser et al. | 250/492.21 |
| 2003/0205683 | A1 * | 11/2003 | Benveniste | 250/492.21 |
| 2004/0097058 | A1 * | 5/2004 | Purser et al. | 438/514 |
| 2005/0017202 | A1 * | 1/2005 | White | 250/492.21 |
| 2005/0082498 | A1 * | 4/2005 | White | 250/492.21 |
| 2005/0242294 | A1 * | 11/2005 | Purser et al. | 250/396 ML |
| 2005/0258380 | A1 * | 11/2005 | White et al. | 250/492.21 |
| 2006/0113494 | A1 * | 6/2006 | Chen et al. | 250/492.21 |
| 2006/0113495 | A1 * | 6/2006 | Chen et al. | 250/492.21 |
| 2007/0170369 | A1 * | 7/2007 | Purser et al. | 250/396 ML |
| 2008/0135775 | A1 * | 6/2008 | Smatlak et al. | 250/396 ML |
| 2008/0169426 | A1 * | 7/2008 | Purser et al. | 250/396 ML |

OTHER PUBLICATIONS

Notice of Allowance received for U.S. Appl. No. 12/053,076, mailed on Aug. 6, 2010, 7 pages.
Non Final Office Action received for U.S. Appl. No. 12/957,294 mailed on Jun. 1, 2012, 20 pages.
Notice of Allowance received for U.S. Appl. No. 12/957,294, mailed on Jan. 14, 2013, 22 pages.
International Search Report and Written Opinion received for PCT Patent Application No. PCT/US2008/057929, mailed on Aug. 27, 2008, 7 pages.
International Preliminary Report on Patentability received for PCT Patent Application No. PCT/US2008/057929, issued on Sep. 22, 2009, 7 pages.
Notice of Allowance received for U.S. Appl. No. 13/889,278, mailed on Oct. 30, 2013, 25 pages.

* cited by examiner

BEAM CONTROL ASSEMBLY FOR RIBBON BEAM OF IONS FOR ION IMPLANTATION

CROSS REFERENCE TO RELATED APPLICATIONS

The present application is a Continuation application of U.S. patent application Ser. No. 13/889,278, filed May 7, 2013, which issued as U.S. Pat. No. 8,680,480 on Mar. 25, 2014, which is a Continuation application of U.S. patent application Ser. No. 12/957,294, filed Nov. 30, 2010, which issued as U.S. Pat. No. 8,502,160 on Aug. 6, 2013, which is a Continuation application of U.S. patent application Ser. No. 12/053,076, filed Mar. 21, 2008, which issued as U.S. Pat. No. 7,851,767 on Dec. 14, 2010, which claims priority to U.S. Provisional Application Ser. No. 60/919,365, filed Mar. 21, 2007, which are incorporated herein by reference in their entirety.

BACKGROUND

1. Field

The present application generally relates to ion implanters, and, more particularly, to a beam control assembly to shape a ribbon beam of ions for ion implantation.

2. Related Art

Ion implanters are used to implant ions in various applications, including semiconductor device fabrication. As depicted in FIG. 1, an ion implanter 100 typically includes an ion source 102 configured to generate the ions, an accelerator 104 configured to accelerate the ions to a desired energy, a beam control assembly 106 configured to shape the ions into a desired pattern, and a target area 108 configured to position the work piece, such as a wafer in semiconductor device fabrication, for ion implantation.

To increase throughput, particularly in semiconductor applications, a ribbon beam of ions is used. In particular, with reference to FIG. 2A, a ribbon beam 202 can be generated and used to implant ion in an area of a work piece, such as a wafer in semiconductor applications. As depicted in FIG. 2A, ribbon beam 202 has a beam width 204 and travels in a beam direction 206.

Various conventional devices and techniques exist for controlling ribbon beam 202. For example, see, U.S. Pat. No. 7,078,713, issued Jul. 18, 2006, and U.S. Pat. No. 6,933,607, issued Aug. 23, 2005, which are incorporated herein by reference in their entireties for all purposes. These conventional devices and techniques have various shortcomings in shaping a ribbon beam of ions for ion implantation.

SUMMARY

In one exemplary embodiment, a beam control assembly to shape a ribbon beam of ions for ion implantation includes a first bar, second bar, first coil of windings of electrical wire, second coil of windings of electrical wire, first electrical power supply, and second electrical power supply. The first coil is disposed on the first bar. The first coil is the only coil disposed on the first bar. The second bar is disposed opposite the first bar with a gap defined between the first and second bars. The ribbon beam travels between the gap. The second coil is disposed on the second bar. The second coil is the only coil disposed on the second bar. The first electrical power supply is connected to the first coil without being electrically connected to any other coil. The second electrical power supply is connected to the second coil without being electrically connected to any other coil.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
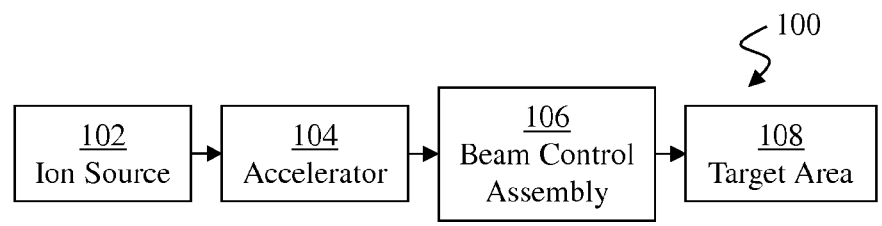
FIG. 1 depicts an ion implanter.
Figure 2A:
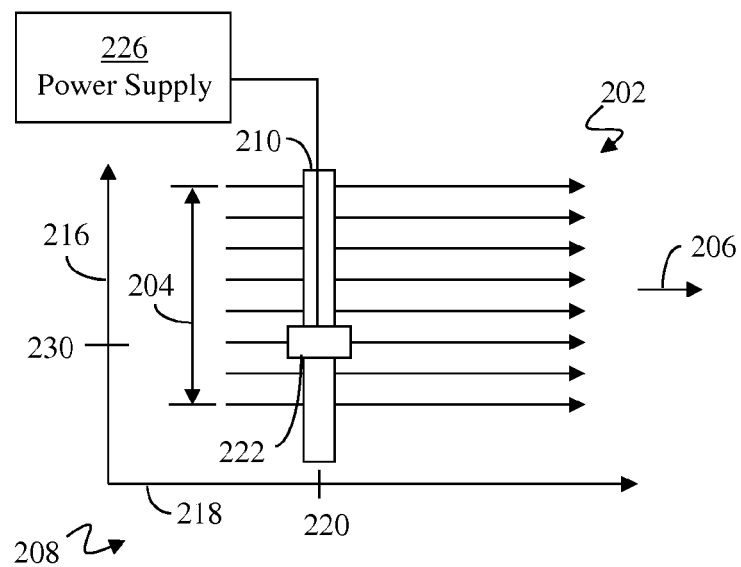
FIG. 2A depicts a ribbon beam of ions.
Figure 2B:
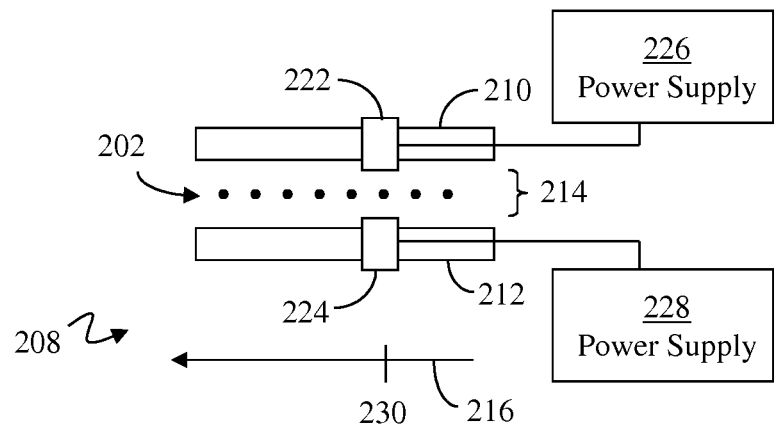
FIGS. 2B and 2C depict an exemplary beam control assembly.

With reference to FIG. 2B, in one exemplary embodiment, a beam control assembly 208 to shape a ribbon beam of ions for ion implantation includes a first bar 210 and a second bar 212. Second bar 212 is disposed opposite first bar 210 to define a gap 214 between second bar 212 and first bar 210. The ribbon beam travels between gap 214.

As depicted in FIG. 2A, a first dimension 216 within beam control assembly 208 corresponds to beam width 204. As also depicted in FIG. 2A, a second dimension 218 within beam control assembly 208 corresponds to beam direction 206.

Figure 2C:
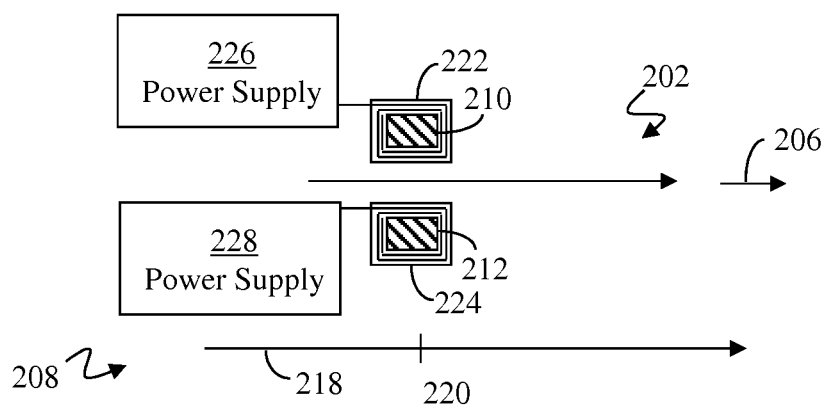
Figure 4:
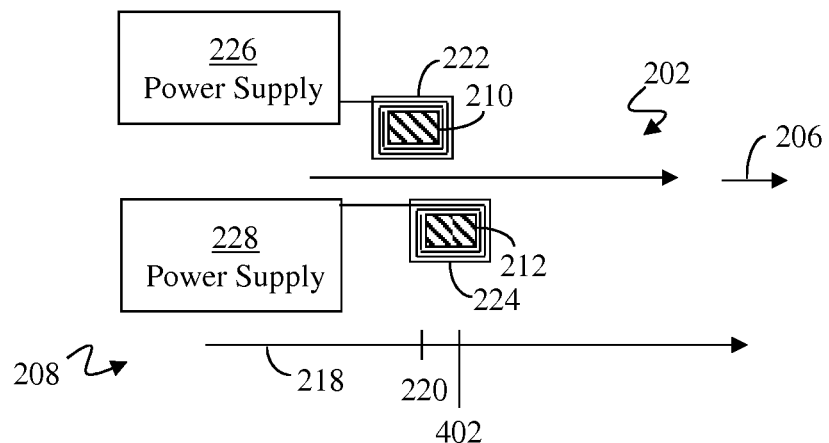
FIGS. 4-9 depict various exemplary beam control assemblies.

In one exemplary embodiment, first bar 210 is located at a first position 220 in second dimension 218 and extends into first dimension 216. In this exemplary embodiment, as depicted in FIGS. 2B and 2C, second bar 212 is also located at first position 220 in second dimension 218 and extends into first dimension 216. Alternatively, as depicted in FIG. 4, second bar 212 can be located at a second position 402 in second dimension 218, which is different than first position 220.

With reference to FIG. 2A, beam control assembly 208 includes a first coil 222 disposed on first bar 210. In the present exemplary embodiment, first coil 222 is the only coil disposed on first bar 210. First coil 222 includes windings of electrical wire. As depicted in FIG. 2C, the windings of first coil 222 are concentric to first bar 210, which corresponds to being wound around first dimension 216 (FIG. 2A).

With reference again to FIG. 2B, beam control assembly 208 includes a second coil 224 disposed on second bar 212. In the present exemplary embodiment, second coil 224 is the only coil disposed on second bar 212. Second coil 224 includes windings of electrical wire. As depicted in FIG. 2C, the windings of second coil 224 are concentric to second bar 212, which corresponds to being wound around first dimension 216 (FIG. 2A).

With reference again to FIG. 2B, beam control assembly 208 includes a first electrical power supply 226 electrically connected to first coil 222 without being electrically connected to any other coil. Beam control 208 also includes a second electrical power supply 228 electrically connected to second coil 224 without being electrically connected to any other coil.

With reference to FIG. 2B, in one exemplary embodiment, first coil 222 is fixed to first position 230 in first dimension 216 on first bar 210. In this exemplary embodiment, second coil 224 is also fixed to first position 230 in first dimension 216 on second bar 212. Second coil 224 is located opposite first coil 222 at first position 230 in first dimension 216. Thus, the portion of ribbon beam 202 adjacent to first position 230 in first dimension 216 can be controlled from both sides of gap 214 using first coil 222 and first electrical power supply 226 and/or second coil 224 and second electrical power supply 228.

Figure 5:
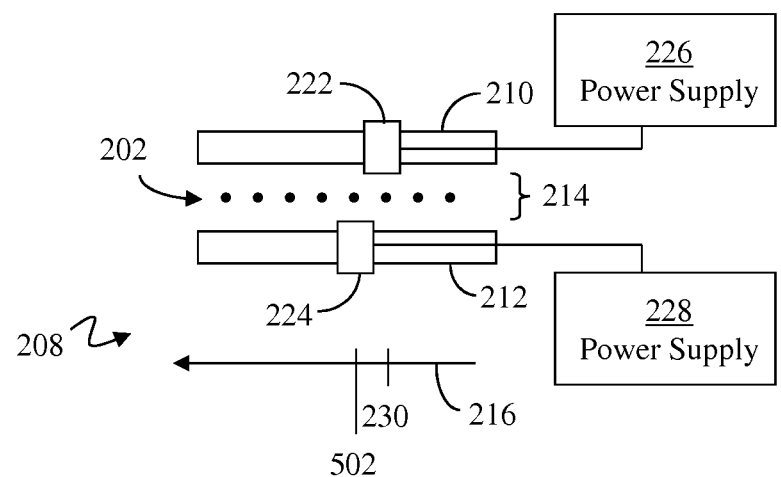

With reference to FIG. 5, in another exemplary embodiment, second coil 224 can be fixed to a second position 502 in first dimension 216 on second bar 212. In this exemplary embodiment, one portion of ribbon beam 202 adjacent to first position 230 in first dimension 216 can be controlled from one side of gap 214 using first coil 222 and first electrical power supply 226, and another portion of ribbon beam 202 adjacent to second position 502 can be controlled from another side of gap 214 using second coil 224 and second electrical power supply 228.

With reference to FIG. 2B, in another exemplary embodiment, first coil 222 is configured to move along first bar 210 to be located at different positions in first dimension 216. Second coil 224 is configured to move along second bar 212 to be located at different positions in first dimension 216. Although not depicted, it should be recognized that first coil 222 and second coil 224 can be moved using various devices, including actuators, tracks, and the like.

Figure 3A:
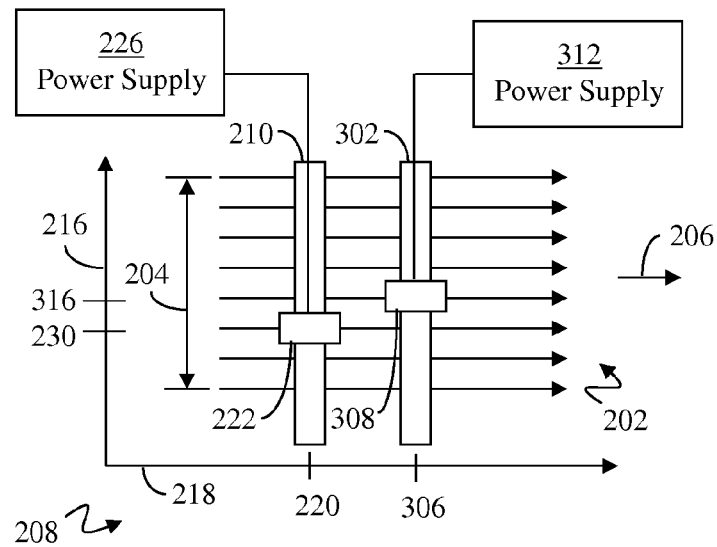
FIGS. 3A-3C depict another exemplary beam control assembly.
Figure 3B:
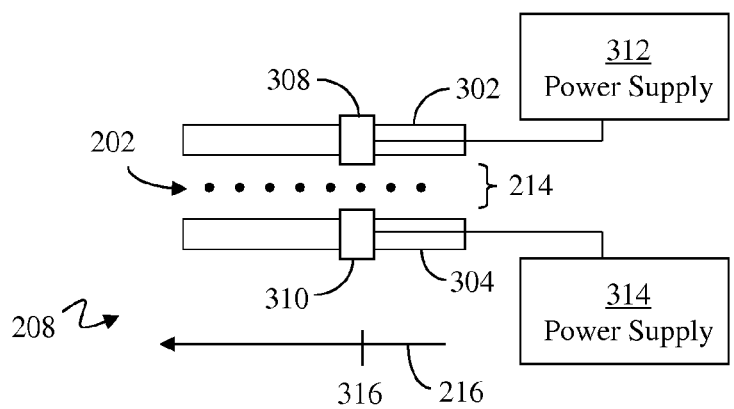

With reference to FIG. 3B, in on exemplary embodiment, beam control assembly 208 includes a third bar 302 and a fourth bar 304. Fourth bar 304 is disposed opposite third bar 302 with gap 214 defined between fourth bar 304 and third bar 302. The ribbon beam travels between gap 214.

Figure 3C:
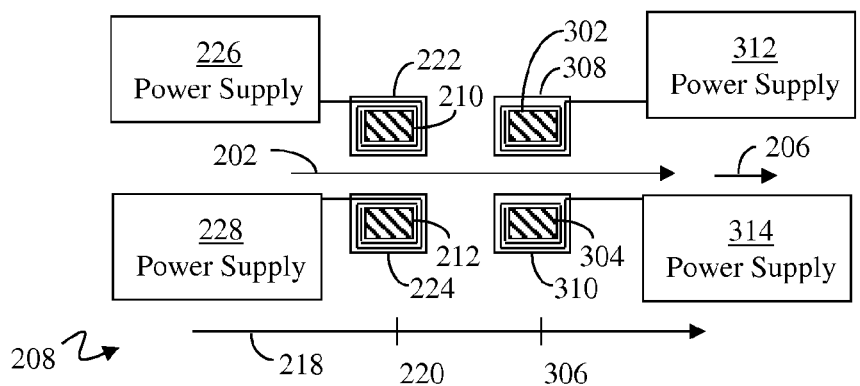
Figure 6:
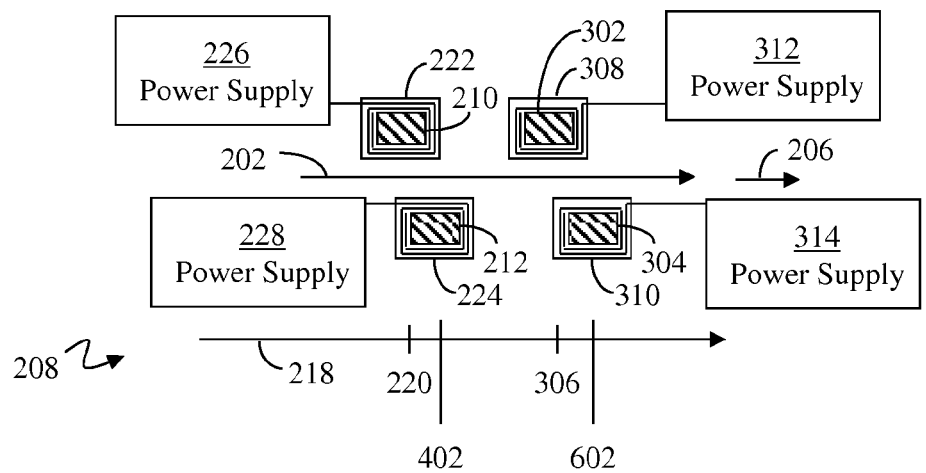

As depicted in FIGS. 3A and 3C, third bar 302 is adjacent first bar 210. Third bar 302 is located at a third position 306 in second dimension 218 and extends into first dimension 216. In one exemplary embodiment, as depicted in FIGS. 3B and 3C, fourth bar 304 is located at third position 306 in second dimension 218 and extends into first dimension 216. Alternatively, as depicted in FIG. 6, fourth bar 304 can be located at fourth position 602 in second dimension 218.

With reference to FIG. 3A, beam control assembly 208 also includes a third coil 308 disposed on third bar 302. In the present exemplary embodiment, third coil 308 is the only coil disposed on third bar 302. Third coil 308 includes windings of electrical wire. As depicted in FIG. 3C, the windings of third coil 308 are concentric to third bar 302, which corresponds to being wound around first dimension 216 (FIG. 3A).

Beam control assembly 208 includes a fourth coil 310 disposed on fourth bar 304. In the present exemplary embodiment, fourth coil 310 is the only coil disposed on fourth bar 304. Fourth coil 310 includes windings of electrical wire. The windings of fourth coil 310 are concentric to fourth bar 304, which corresponds to being wound around first dimension 216 (FIG. 2A).

Beam control assembly 208 includes a third electrical power supply 312 electrically connected to third coil 308 without being electrically connected to any other coil. Beam control 208 also includes a fourth electrical power supply 314 electrically connected to fourth coil 310 without being electrically connected to any other coil.

With reference to FIG. 3B, in one exemplary embodiment, third coil 308 is fixed to a third position 316 in first dimension 216 on third bar 302. In this exemplary embodiment, fourth coil 310 is also fixed to third position 316 in first dimension 216 on fourth bar 304. Fourth coil 310 is located opposite third coil 308 at third position 316 in first dimension 216. Thus, the portion of ribbon beam 202 adjacent to third position 316 in first dimension 216 can be controlled from both sides of gap 214 using third coil 308 and third electrical power supply 312 and/or fourth coil 310 and fourth electrical power supply 314.

Figure 7:
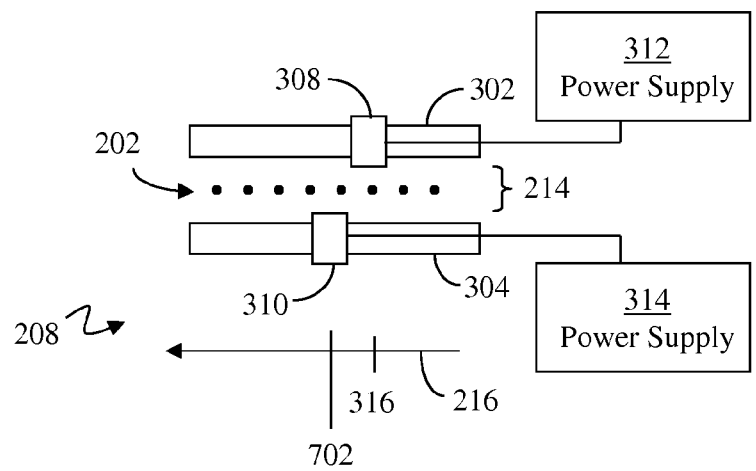

With reference to FIG. 7, in another exemplary embodiment, fourth coil 310 can be fixed to a fourth position 702 in first dimension 216 on fourth bar 304. In this exemplary embodiment, one portion of ribbon beam 202 adjacent to third position 316 in first dimension 216 can be controlled from one side of gap 214 using third coil 308 and third electrical power supply 312, and another portion of ribbon beam 202 adjacent to fourth position 702 can be controlled from another side of gap 214 using fourth coil 310 and second electrical power supply 314.

With reference to FIG. 3B, in another exemplary embodiment, third coil 308 is configured to move along third bar 302 to be located at different positions in first dimension 216. Fourth coil 310 is configured to move along fourth bar 304 to be located at different positions in first dimension 216. Although not depicted, it should be recognized that third coil 308 and fourth coil 310 can be moved using various devices, including actuators, tracks, and the like.

In the exemplary embodiment depicted in FIG. 3A, first bar 210 and third bar 302 are depicted as extending in first dimension 216 across the entire beam width 204 of ribbon beam 202. As depicted in FIGS. 2B and 3B, second bar 212 and fourth bar 304 also extend in first dimension 216 across the entire beam width 204. Additionally, in this exemplary embodiment, first bar 210, second bar 212, third bar 302, and fourth bar 304 all extend from the same side of beam control assembly 208. One advantage to this exemplary embodiment is that supply lines, including electrical lines, can be supplied from the same side.

Figure 8:
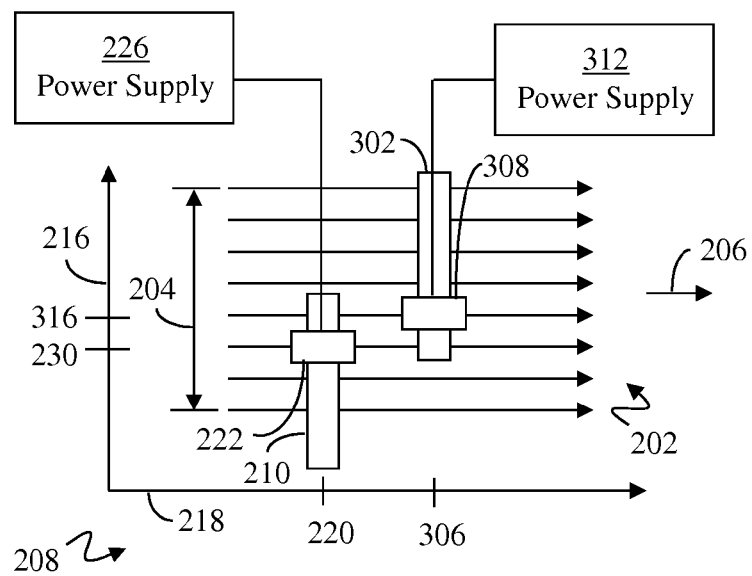

With reference to FIG. 8, in another exemplary embodiment, first bar 210 and third bar 302 extend in first dimension 216 across only a portion of beam width 204 of ribbon beam 202. Although not depicted, it should be recognized that second bar 212 and fourth bar 304 also extend in first dimension 216 across only a portion of beam width 204 of ribbon beam 202. As depicted in FIG. 8, in this exemplary embodiment, first bar 210 and third bar 302 can extend from opposite sides of beam control assembly 208. Similarly, second bar 212 and fourth bar 304 can also extend from opposite sides of beam control assembly 208.

With reference to FIGS. 3A and 8, when first coil 222 and third coil 308 are fixed to first position 230 and third position 316, respectively, on first bar 210 and third bar 302, respectively, first coil 222 and third coil 308 can be positioned such that the portion of ribbon beam 202 adjacent to first coil 222 overlaps with the portion of ribbon beam 202 adjacent to third coil 308. In a similar manner, second coil 224 and fourth coil 310 can be positioned such that the portion of ribbon beam 202 adjacent to second coil 224 overlaps with the portion of ribbon beam 202 adjacent to fourth coil 310.

Figure 9:
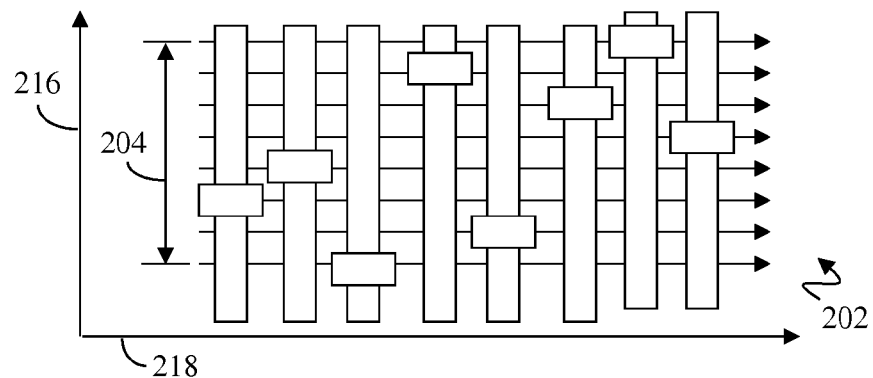

It should be recognized that beam control assembly 208 can include any number of bars located at different positions along second dimension 218, each bar having only one coil disposed on the bar, with the coils of the different bars located at different positions along first dimension 216. For example, FIG. 9 depicts 8 bars located at 8 different positions along second dimension 218, each bar having only one coil disposed on the bar, with the 8 coils of the 8 different bars located at 8 different positions along first dimension 216 such that the entire beam width 204 of ribbon beam 202 can be controlled separately by the coils.

Figure 10:
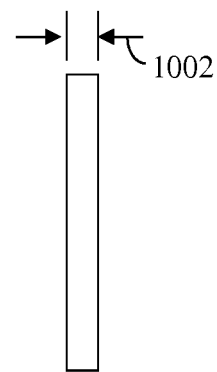
FIG. 10 depicts an exemplary bar that can be used in an exemplary beam control assembly.

With reference to FIG. 10, in one exemplary embodiment, the bars described above (such as first bar 210 in FIG. 2) are steel bars. As depicted in FIG. 10, the bars can have a greatest width 1002 of about 50 to 100 mm. It should be recognized, however, that the bars can be made of various types of materials, and have various dimensions.

Also, the coils described above (such as first coil 222 in FIG. 2A) were described as being windings of electrical wire. In one exemplary embodiment, the coils are copper wires. It should be recognized, however, that the coils can be made of various types of electrically conductive material.

Although exemplary embodiments have been described, various modifications can be made without departing from the spirit and/or scope of the present invention. Therefore, the present invention should not be construed as being limited to the specific forms shown in the drawings and described above.

I claim:

1. A beam control assembly to shape a ribbon beam of ions for ion implantation, the beam control assembly comprising:
    a first bar, wherein the ribbon beam has a beam width and travels in a beam direction, wherein a first dimension corresponds to the beam width and a second dimension corresponds to the beam direction of the ribbon beam, and wherein the first bar is located at a first position in the second dimension and extends into the first dimension;
    a first coil disposed on the first bar, wherein the first coil is the only coil disposed on the first bar, wherein the first coil includes windings of electrical wire, and wherein the first coil is fixed to a first position in the first dimension on the first bar, and wherein the first coil extends over less than the entire width of the ribbon beam in the first dimension;
    a second bar disposed opposite the first bar with a gap defined between the first bar and second bar, wherein the ribbon beam travels between the gap, wherein the second bar is located at a second position in the second dimension and extends into the first dimension, and wherein the first and second positions in the second dimension are different;
    a second coil disposed on the second bar, wherein the second coil is the only coil disposed on the second bar, wherein the second coil includes windings of electrical wire, wherein the second coil is fixed to a second position in the first dimension on the second bar, wherein the second coil extends over less than the entire width of the ribbon beam in the first dimension, and wherein the first and second positions in the first dimension are the same;
    a first electrical power supply connected to the first coil without being electrically connected to any other coil; and
    a second electrical power supply connected to the second coil without being electrically connected to any other coil.

2. The beam control assembly of claim 1, further comprising:
    a third bar, wherein the third bar is located at a third position in the second dimension and extends into the first dimension;
    a third coil disposed on the third bar, wherein the third coil is the only coil disposed on the third bar, wherein the third coil includes windings of electrical wire; and
    a third electrical power supply connected to the third coil without being electrically connected to any other coil.

3. The beam control assembly of claim 2, wherein the third coil is configured to move along the third bar to be located at different positions in the first dimension on the third bar.

4. The beam control assembly of claim 2, wherein the third coil is fixed to a third position in the first dimension on the third bar.

5. The beam control assembly of claim 1, wherein the first and second bars extend in the first dimension across the entire beam width.

6. The beam control assembly of claim 5, wherein the first and second bars extend from one side of the beam control assembly.

7. The beam control assembly of claim 1, wherein the first and second bars extend in the first dimension across a portion of the beam width.

8. The beam control assembly of claim 7, wherein the first bar extends from one side of the beam control assembly, and wherein the second bar extends from an opposite side of the beam control assembly as the first bar.

9. The beam control assembly of claim 1, wherein a portion of the ribbon beam adjacent to the first coil overlaps with a portion of the ribbon beam adjacent to the second coil.

10. An ion implanter to implant ions using a ribbon beam of ions, comprising:
    an ion source;
    an accelerator configured to accelerate the ion disposed adjacent to the ion source;
    a beam control assembly disposed adjacent to the accelerator, the beam control assembly comprising:
        a first bar, wherein the ribbon beam has a beam width and travels in a beam direction, wherein a first dimension corresponds to the beam width and a second dimension corresponds to the beam direction of the ribbon beam, and wherein the first bar is located at a first position in the second dimension and extends into the first dimension;
        a first coil disposed on the first bar, wherein the first coil is the only coil disposed on the first bar, wherein the first coil includes windings of electrical wire, and wherein the first coil is fixed to a first position in the first dimension on the first bar, and wherein the first coil extends over less than the entire width of the ribbon beam in the first dimension;
        a second bar disposed opposite the first bar with a gap defined between the first bar and second bar, wherein the ribbon beam travels between the gap, wherein the second bar is located at a second position in the second dimension and extends into the first dimension, and wherein the first and second positions in the second dimension are different;
        a second coil disposed on the second bar, wherein the second coil is the only coil disposed on the second bar, wherein the second coil includes windings of electrical wire, wherein the second coil is fixed to a second position in the first dimension on the second bar, wherein the second coil extends over less than the entire width of the ribbon beam in the first dimension, and wherein the first and second positions in the first dimension are the same;
        a first electrical power supply connected to the first coil without being electrically connected to any other coil; and
        a second electrical power supply connected to the second coil without being electrically connected to any other coil; and a target area disposed adjacent to the beam control assembly, the target area configured to position a work piece.

11. A method of controlling a ribbon beam of ions, the method comprising:

applying an electrical charge to a first coil using a first electrical power supply, wherein the first electrical power supply is connected to the first coil without being electrically connected to any other coil, wherein the first coil is disposed on a first bar, wherein the ribbon beam has a beam width and travels in a beam direction, wherein a first dimension corresponds to the beam width and a second dimension corresponds to the beam direction of the ribbon beam, wherein the first bar is located at a first position in the second dimension and extends into the first dimension, wherein the first coil is the only coil disposed on the first bar, wherein the first coil includes windings of electrical wire, and wherein the first coil is fixed to a first position in the first dimension on the first bar, and wherein the first coil extends over less than the entire width of the ribbon beam in the first dimension; and applying an electrical charge to a second coil using a second electrical power supply, wherein the second electrical power supply is connected to the second coil without being electrically connected to another other coil, wherein the second coil is disposed on a second bar, wherein the second bar is located at a second position in the second dimension and extends into the first dimension, wherein the first and second positions in the second dimension are different, wherein the second coil is the only coil disposed on the second bar, wherein the second coil includes windings of electrical wire, wherein the second coil is fixed to a second position in the first dimension on the second bar, wherein the second coil extends over less than the entire width of the ribbon beam in the first dimension, wherein the first and second positions in the first dimension are the same, and wherein the second bar is disposed opposite the first bar with a first gap defined between the first bar and second bar, and wherein the ribbon beam travels between the first gap.

12. The ion implanter of claim 10, further comprising:
a third bar, wherein the third bar is located at a third position in the second dimension and extends into the first dimension;
a third coil disposed on the third bar, wherein the third coil is the only coil disposed on the third bar, wherein the third coil includes windings of electrical wire; and
a third electrical power supply connected to the third coil without being electrically connected to any other coil.

13. The ion implanter of claim 12, wherein the third coil is configured to move along the third bar to be located at different positions in the first dimension on the third bar.

14. The ion implanter of claim 12, wherein the third coil is fixed to a third position in the first dimension on the third bar.

15. The ion implanter of claim 10, wherein the first and second bars extend in the first dimension across the entire beam width.

16. The ion implanter of claim 15, wherein the first and second bars extend from one side of the beam control assembly.

17. The ion implanter of claim 10, wherein the first and second bars extend in the first dimension across a portion of the beam width.

18. The ion implanter of claim 17, wherein the first bar extends from one side of the beam control assembly, and wherein the second bar extends from an opposite side of the beam control assembly as the first bar.

19. The ion implanter of claim 10, wherein a portion of the ribbon beam adjacent to the first coil overlaps with a portion of the ribbon beam adjacent to the second coil.

* * * * *